(12) United States Patent
Ko et al.

(10) Patent No.: US 11,476,419 B2
(45) Date of Patent: Oct. 18, 2022

(54) METHOD FOR MANUFACTURING A SEMICONDUCTOR DEVICE INCLUDING A LOW-K DIELECTRIC MATERIAL LAYER

(71) Applicant: SAMSUNG ELECTRONICS CO., LTD., Suwon-si (KR)

(72) Inventors: Youngmin Ko, Hwaseong-si (KR); Jonguk Kim, Yongin-si (KR); Jaeho Jung, Seoul (KR); Dongsung Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 253 days.

(21) Appl. No.: 16/874,781

(22) Filed: May 15, 2020

(65) Prior Publication Data

US 2021/0050520 A1    Feb. 18, 2021

(30) Foreign Application Priority Data

Aug. 16, 2019    (KR) .................... 10-2019-0100384

(51) Int. Cl.
*H01L 45/00* (2006.01)
*H01L 27/24* (2006.01)
(Continued)

(52) U.S. Cl.
CPC ............... *H01L 45/16* (2013.01); *B05D 1/60* (2013.01); *B05D 3/046* (2013.01); *B05D 3/0453* (2013.01);
(Continued)

(58) Field of Classification Search
None
See application file for complete search history.

(56) References Cited

U.S. PATENT DOCUMENTS 7,071,540 B2    7/2006    Lyu et al.
7,611,996 B2    11/2009   Schmitt et al.
(Continued)

FOREIGN PATENT DOCUMENTS

KR    10-1999-0001918    1/1999
KR    10-2003-0050694    6/2003
(Continued)

*Primary Examiner* — Shamim Ahmed
*Assistant Examiner* — Bradford M Gates
(74) *Attorney, Agent, or Firm* — F. Chau & Associates, LLC

(57) ABSTRACT

A method for manufacturing a semiconductor device includes forming a first pattern structure having a first opening on a lower structure comprising a semiconductor substrate. The first pattern structure includes a stacked pattern and a first spacer layer covering at least a side surface of the stacked pattern. A first flowable material layer including a SiOCH material is formed on the first spacer layer to fill the first opening and cover an upper portion of the first pattern structure. A first curing process including supplying a gaseous ammonia catalyst into the first flowable material layer is performed on the first flowable material layer to form a first cured material layer that includes water. A second curing process is performed on the first cured material layer to form a first low-k dielectric material layer. The first low-k dielectric material layer is planarized to form a planarized first low-k dielectric material layer.

20 Claims, 10 Drawing Sheets

(51) Int. Cl.
*C08G 77/20* (2006.01)
*H01L 21/02* (2006.01)
*B05D 1/00* (2006.01)
*B05D 3/04* (2006.01)
*B05D 3/10* (2006.01)

(52) U.S. Cl.
CPC ............ *B05D 3/107* (2013.01); *C08G 77/20* (2013.01); *H01L 21/02126* (2013.01); *H01L 21/02216* (2013.01); *H01L 21/02271* (2013.01); *H01L 27/2427* (2013.01); *H01L 27/2463* (2013.01); *H01L 45/06* (2013.01); *H01L 45/126* (2013.01); *H01L 45/1233* (2013.01); *H01L 45/144* (2013.01)

(56) References Cited

U.S. PATENT DOCUMENTS

| | | | |
|---|---|---|---|
| 8,889,233 | B1 | 11/2014 | Kelman et al. |
| 9,892,964 | B1 | 2/2018 | Moon et al. |
| 2003/0124707 | A1 | 7/2003 | Kim et al. |
| 2006/0127587 | A1 | 8/2006 | Kang et al. |
| 2008/0206954 | A1 | 8/2008 | Choi et al. |
| 2009/0004818 | A1 | 1/2009 | Shin et al. |
| 2009/0277587 | A1 | 11/2009 | Lubomirsky et al. |
| 2010/0240194 | A1 | 9/2010 | Jung et al. |
| 2011/0111137 | A1 | 5/2011 | Liang et al. |
| 2011/0151677 | A1 | 6/2011 | Wang et al. |
| 2011/0165781 | A1 | 7/2011 | Liang et al. |
| 2012/0083117 | A1* | 4/2012 | Ahn .................. H01L 21/3105 438/653 |
| 2012/0102885 | A1 | 5/2012 | Sharp et al. |
| 2012/0142192 | A1 | 6/2012 | Li et al. |
| 2012/0177846 | A1 | 7/2012 | Li et al. |
| 2012/0269989 | A1 | 10/2012 | Liang et al. |
| 2013/0288485 | A1 | 10/2013 | Liang et al. |
| 2014/0045342 | A1 | 2/2014 | Mallick et al. |
| 2014/0256876 | A1 | 9/2014 | Kim et al. |
| 2015/0056821 | A1* | 2/2015 | Ishikawa ............ H01L 21/0234 438/789 |
| 2015/0118862 | A1 | 4/2015 | Reilly et al. |
| 2015/0170956 | A1 | 6/2015 | Naik et al. |
| 2015/0357184 | A1 | 12/2015 | Jongbloed et al. |
| 2016/0093488 | A1* | 3/2016 | Thadani .................. C23C 16/56 438/786 |
| 2017/0114465 | A1 | 4/2017 | Kalutarage et al. |
| 2017/0372919 | A1 | 12/2017 | Manna et al. |
| 2019/0088871 | A1* | 3/2019 | Kim .................... H01L 45/1233 |

FOREIGN PATENT DOCUMENTS

| | | |
|---|---|---|
| KR | 10-0800495 | 2/2008 |
| KR | 10-2009-0000399 | 1/2009 |
| KR | 10-2010-0106127 | 10/2010 |
| KR | 10-2011-0010631 | 2/2011 |
| KR | 10-2011-0058788 | 6/2011 |
| KR | 10-2012-0043073 | 5/2012 |
| KR | 10-2012-0052149 | 5/2012 |
| KR | 10-2012-0094490 | 8/2012 |
| KR | 10-2012-0102155 | 9/2012 |
| KR | 10-2012-0123668 | 11/2012 |
| KR | 10-2013-0093103 | 8/2013 |
| KR | 10-2013-0135301 | 12/2013 |
| KR | 10-2013-0135392 | 12/2013 |
| KR | 10-2015-0009959 | 1/2015 |
| KR | 10-2015-0041122 | 4/2015 |
| KR | 10-2015-0048084 | 5/2015 |
| KR | 10-2015-0140232 | 12/2015 |
| KR | 10-2016-0098483 | 8/2016 |
| KR | 10-2016-0112006 | 9/2016 |
| KR | 10-2018-0028541 | 3/2018 |
| KR | 10-2018-0058232 | 5/2018 |
| KR | 10-2019-0011817 | 2/2019 |

* cited by examiner

METHOD FOR MANUFACTURING A SEMICONDUCTOR DEVICE INCLUDING A LOW-K DIELECTRIC MATERIAL LAYER

CROSS-REFERENCE TO RELATED APPLICATION(S)

This application claims priority under 35 U.S.C. § 119 to Korean Patent Application No. 10-2019-0100384, filed on Aug. 16, 2019 in the Korean Intellectual Property Office, the disclosure of which is incorporated by reference in its entirety herein.

1. TECHNICAL FIELD

The present inventive concepts relate to methods for manufacturing a semiconductor device, and more particularly, to a method for manufacturing a semiconductor device including a low-k dielectric material layer and the semiconductor device.

A low-k dielectric material may be used as an insulating material that fills a space between interconnections. The low-k dielectric material reduces parasitic capacitance between the interconnections.

SUMMARY

Exemplary embodiments of the present inventive concepts provide a method for manufacturing a semiconductor device including a low-k dielectric material layer and the semiconductor device.

According to an exemplary embodiment of the present inventive concepts, a method for manufacturing a semiconductor device includes forming a first pattern structure having a first opening on a lower structure comprising a semiconductor substrate. The first pattern structure comprises a stacked pattern and a first spacer layer covering at least a side surface of the stacked pattern. A first flowable material layer is formed on the first spacer layer to fill the first opening and cover an upper portion of the first pattern structure. The first flowable material layer includes a SiOCH material. A first curing process is performed on the first flowable material layer to form a first cured material layer that includes water ($H_2O$). The performing of the first curing process comprises supplying a gaseous ammonia ($NH_3$) catalyst into the first flowable material layer. The first curing process is configured to cure the first flowable material layer while generating the water ($H_2O$) in the first flowable material layer. A second curing process is performed on the first cured material layer to form a first low-k dielectric material layer. The second curing process is configured to evaporate the water ($H_2O$) in the first cured material layer outwardly of the first cured material layer. The first low-k dielectric material layer is planarized using a first chemical mechanical polishing process to form a planarized first low-k dielectric material layer.

According to an exemplary embodiment of the present inventive concepts, a method for manufacturing a semiconductor device includes forming a structure having an opening on a lower structure. A flowable material layer is formed to fill the opening and cover an upper portion of the structure. A first curing process is performed on the flowable material layer to form a cured material layer. A second curing process is performed on the cured material layer to form a low-k dielectric material layer. The low-k dielectric material layer is planarized to form a planarized low-k dielectric material layer in the opening. A volume reduction rate when the flowable material is formed as the cured material layer is greater than a volume reduction rate when the cured material layer is formed as the low-k dielectric material layer.

According to an exemplary embodiment of the present inventive concepts, a method for manufacturing a semiconductor device includes forming a flowable material layer on a lower structure. A first curing process is performed by supplying an ammonia ($NH_3$) catalyst gas into the flowable material layer at a temperature of about 23° C. or more to less than 100° C. to form a cured material layer. A second curing process is performed at a temperature of 100° C. or more on the cured material layer to form a low-k dielectric material layer. The flowable material layer includes a SiOCH material. The water ($H_2O$) is generated during the first curing process. The water ($H_2O$) that is generated during the first curing process is included in the cured material layer. The water ($H_2O$) in the cured material layer is evaporated and removed during the second curing process. Hydrogen (H) in the cured material layer is removed in the second curing process, to form the low-k dielectric layer of a SiOC material.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION OF EXEMPLARY EMBODIMENTS

Hereinafter, exemplary embodiments of the present inventive concepts will be described with reference to the accompanying drawings.

Figure 1:
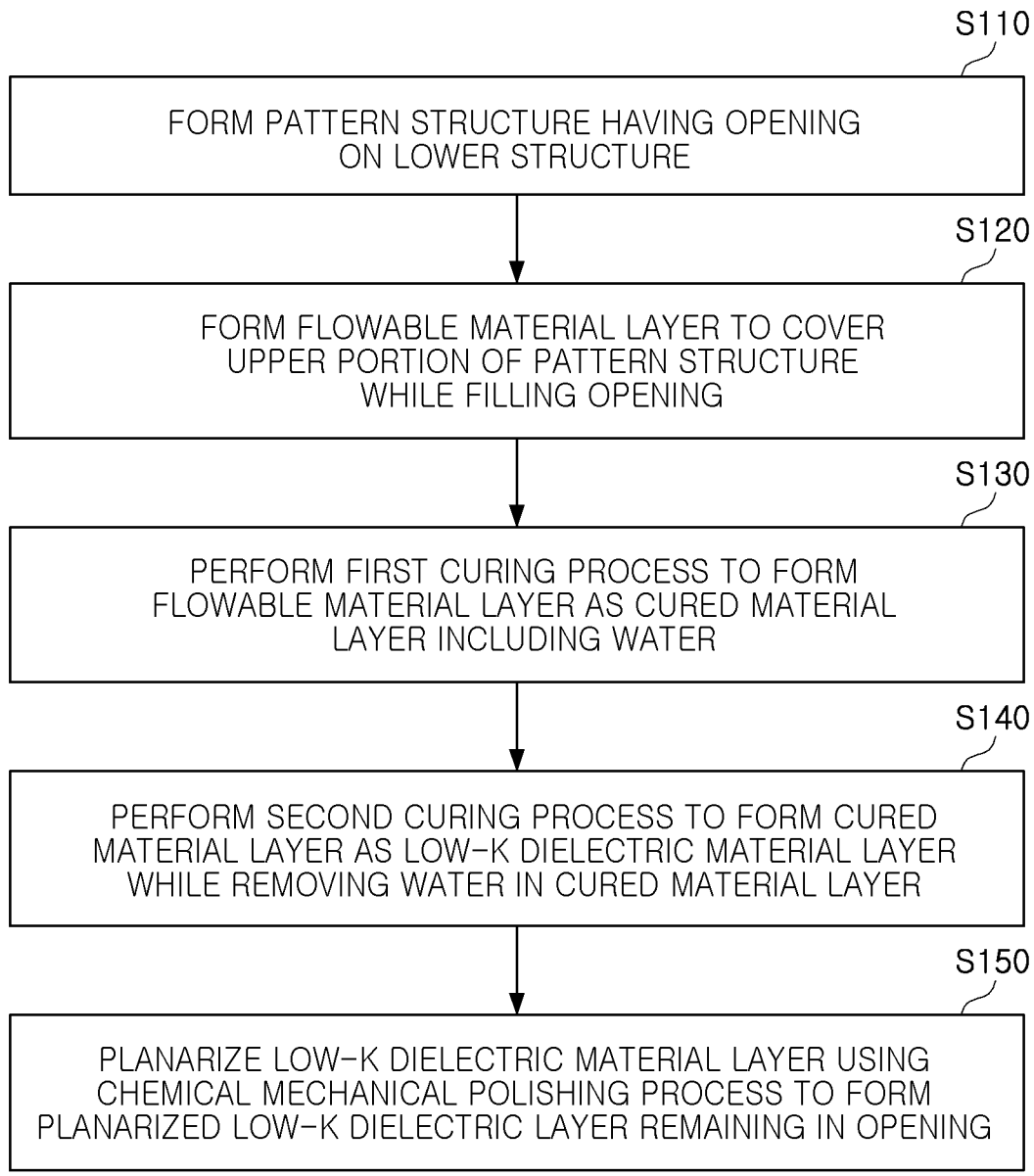
FIG. 1 is a process flowchart illustrating a method for manufacturing a semiconductor device according to an exemplary embodiment of the present inventive concepts.

A method for manufacturing a semiconductor device according to exemplary embodiments of the present inventive concepts will be described with reference to FIG. 1. FIG. 1 is a process flowchart illustrating a method for manufacturing a semiconductor device according to an exemplary embodiment of the present inventive concepts.

Referring to the exemplary embodiment of FIG. 1, in block S110 a pattern structure having an opening may be formed on a lower structure. In an exemplary embodiment, the lower structure may include a semiconductor substrate, and the pattern structure may be a structure that is formed for fabricating a semiconductor device. In an exemplary embodiment, the pattern structure may include a memory cell of a memory device. In another exemplary embodiment, the pattern structure may include a gate structure of a logic device or another structure having an opening. However, exemplary embodiments of the present inventive concepts are not limited thereto.

As shown in the exemplary embodiment of FIG. 1, in block S120, a flowable material layer may be formed to cover an upper portion of the pattern structure while filling the opening. In an exemplary embodiment, the flowable material layer may be formed by a flowable chemical vapor deposition (CVD) process. However, exemplary embodiments of the present inventive concepts are not limited thereto.

In an exemplary embodiment, the flowable material layer may include a flowable SiOCH material that includes compositions having Chemical Formula 1.

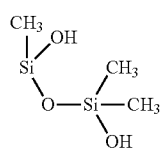

Chemical Formula 1

For example, in an exemplary embodiment of the present inventive concepts, the forming of the flowable material layer on the lower structure including the semiconductor substrate may be performed by a flowable CVD process using octamethylcyclotetrasiloxane (OMCTS) as a precursor and using at least one compound selected from tetramethyl orthosilicate (TMOS) and tetraethyl orthosilicate (TEOS) as an additive. The TMOS and/or TEOS additive may be added to the OMCTS precursor to provide a cross-linking role.

As shown in the exemplary embodiment of FIG. 1, in block S130, a first curing process may be performed to form the flowable material layer as a cured material layer that includes water.

In Chemical Formula 1 of the flowable material layer, a SiOCH material may be formed as a cured material layer having Chemical Formula 2. A siloxane bond between silicon-hydroxyl (Si-Hydroxyl) groups, for example, "Si—O—Si linkage" may be formed by the first curing process.

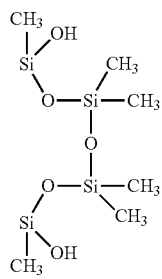

Chemical Formula 2

In an exemplary embodiment, the first curing process may be performed in an ammonia ($NH_3$) catalyst gas atmosphere. Water ($H_2O$) may be formed in the flowable material layer while performing the first curing process. For example, water ($H_2O$) may be formed as a byproduct while forming the above-mentioned siloxane bond. For example, water ($H_2O$) may be formed as a byproduct by reacting a catalyst gas of ammonia ($NH_3$) with one "H" of an "OH" substituent in Chemical Formula 1 to form $NH_4^+$ and reacting the $NH_4^+$ with any one "OH" of an "OH" substituent in Chemical Formula 1 to convert the $NH_4^+$ to $NH_3^+$. As described herein, $H_2O$ formed as a byproduct may remain in the cured material layer even after the first curing process is finished.

In an exemplary embodiment, the performing of the first curing process to form the flowable material layer as the cured material layer may include supplying a gaseous ammonia ($NH_3$) catalyst into the flowable material layer to form water ($H_2O$) in the flowable material layer and curing the flowable material to prevent the formed water ($H_2O$) from being evaporated outwardly of the flowable material layer. For example, the first curing process may be performed in a process condition, in which water is not evaporated, for example, the first curing process may be performed at a temperature less than about 100 degrees Celsius (° C.). In an exemplary embodiment, the first curing process may be performed at a temperature of about 23° C. or more to less than about 100° C. For example, the first curing process may be performed at a temperature of about 40° C. or more to less than about 80° C. However, exemplary embodiments of the present inventive concepts are not limited thereto.

As shown in the exemplary embodiment of FIG. 1, in block S140, the second curing process may be performed on the cured material layer to form a low-k dielectric material layer while removing the water in the cured material layer.

In the second curing process, the water in the cured material layer may be evaporated outwardly of the cured material layer to remove the water therefrom. In an exemplary embodiment, the low dielectric material layer may be formed of SiOC material having a dielectric constant that is lower than a dielectric constant of silicon dioxide. For example, the low dielectric material layer may be formed of a SiOC material having Chemical Formula 3.

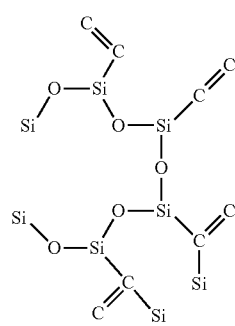

Chemical Formula 3

In an exemplary embodiment, the second curing process may be performed at a temperature of about 100° C. or higher to remove the water remaining in the cured material layer and/or water that is generated while converting the cured material layer into the low dielectric material layer.

The second curing process may be performed at a temperature at which the lower structure and the pattern structure are not thermally damaged. For example, when the pattern structure is a memory cell of a phase change memory device including a phase change material, the second curing process may be performed at a temperature of about 100° C. or more to about 300° C. or less. For example, in an exemplary embodiment in which the pattern structure includes a phase change material layer in an amorphous phase, the second curing process may be performed at a temperature at which the amorphous phase is maintained. For example, in an exemplary embodiment, the second curing process may be performed at a temperature of about 150° C. or more to about 250° C. or less.

In an exemplary embodiment, the second curing process may further include using at least one of an ultraviolet (UV) process and an ammonia catalyst process. The UV process may include irradiating UV to a surface of the cured material layer, and the ammonia catalyzed process may include supplying an ammonia catalyst gas to the surface of the cured material layer.

In an exemplary embodiment, the second curing process may include irradiating UV to the surface of the cured material layer in a temperature atmosphere of about 100° C. or more.

In another exemplary embodiment, the second curing process may include supplying the ammonia catalyst gas to the surface of the cured material layer in a temperature atmosphere of about 100° C. or more.

In another exemplary embodiment, the second curing process may include supplying the ammonia catalyst gas to the surface of the cured material layer while irradiating UV onto the surface of the cured material layer in a temperature atmosphere of about 100° C. or more.

In an exemplary embodiment, the second curing process may be repeated at least one time. For example, in an exemplary embodiment, the second curing process may be performed a total of two or three times. However, exemplary embodiments of the present inventive concepts are not limited thereto.

In an exemplary embodiment, the first and second curing processes may be performed in a process atmosphere of pressure that is lower than atmospheric pressure.

In an exemplary embodiment, the first curing process may be performed at a first pressure that is lower than atmospheric pressure, and the second curing process may be performed at a second pressure that is lower than atmospheric pressure but is higher than the first atmospheric pressure. For example, the first curing process may be performed in a process atmosphere of about 0.1 Torr to about 20 Torr, and the second curing process may be performed in a process atmosphere of about 300 Torr to about 550 Torr. However, exemplary embodiments of the present inventive concepts are not limited thereto.

The second curing process may include removing hydrogen (H) in Chemical Formula 2 of the cured material layer as well as the water in the cured material layer.

While the cured material layer is converted into the low-k dielectric material layer by the second curing process, a gas such as $H_2$, $C_xH_y$, or the like, may be generated. The gas may be generated by the second curing process.

In an exemplary embodiment, the low-k dielectric material layer may have pores.

The low-k dielectric material layer may have pores having different sizes. For example, the low-k dielectric material layer may have a first pore and a second pore larger than the first pore. However, in other exemplary embodiments, the low-k dielectric material layer may have pores having a uniform size.

As the cured material layer having Chemical Formula 2 is converted into the low-k dielectric material layer having Chemical Formula 3 by the second curing process, the above-mentioned siloxane bond, for example, "Si—O—Si" bonding may be maintained.

In the second curing process, the "Si—O—Si" bonding structure remains substantially intact. Since the "Si—O—Si" bonding structure reacts with a silicon-hydroxyl (Si-Hydroxyl) group of the cured material layer remaining after the first curing process is finished, an additional volume reduction, caused by the second curing process may not occur.

In an exemplary embodiment, when the flowable material layer is formed of the low-k dielectric material, a volume reduction rate may be about 2% or less (e.g., 2% or less of the total initial volume of the flowable material layer is removed by performing the first curing process and the second curing process). For example, the volume reduction rate may be about 1% or less. In contrast, the volume reduction rate when the flowable material layer is formed as the cured material layer by the first curing process may be greater than a volume reduction rate when the cured material layer is formed as the low-k material layer by the second curing process.

The low-k dielectric material layer formed by the second curing process may be cured more rigidly than the cured material layer formed by the first curing process and without a substantial volume reduction.

As shown in the exemplary embodiment of FIG. 1, in block S150, the low-k dielectric material layer may then be planarized to form a planarized low-k dielectric material layer remaining in the opening. For example, the low-k dielectric material layer may be planarized by a chemical mechanical polishing (CMP) or the like. However, exemplary embodiments of the present inventive concepts are not limited thereto.

When the CMP process is performed after the low-k dielectric material layer is formed in the second curing process as described above, the low-k dielectric material layer may be formed in a rigid state while having a low dielectric constant. Since the low-k dielectric material layer is formed in a rigid state, the pattern structure may be prevented from being damaged by the CMP process.

Figure 2:
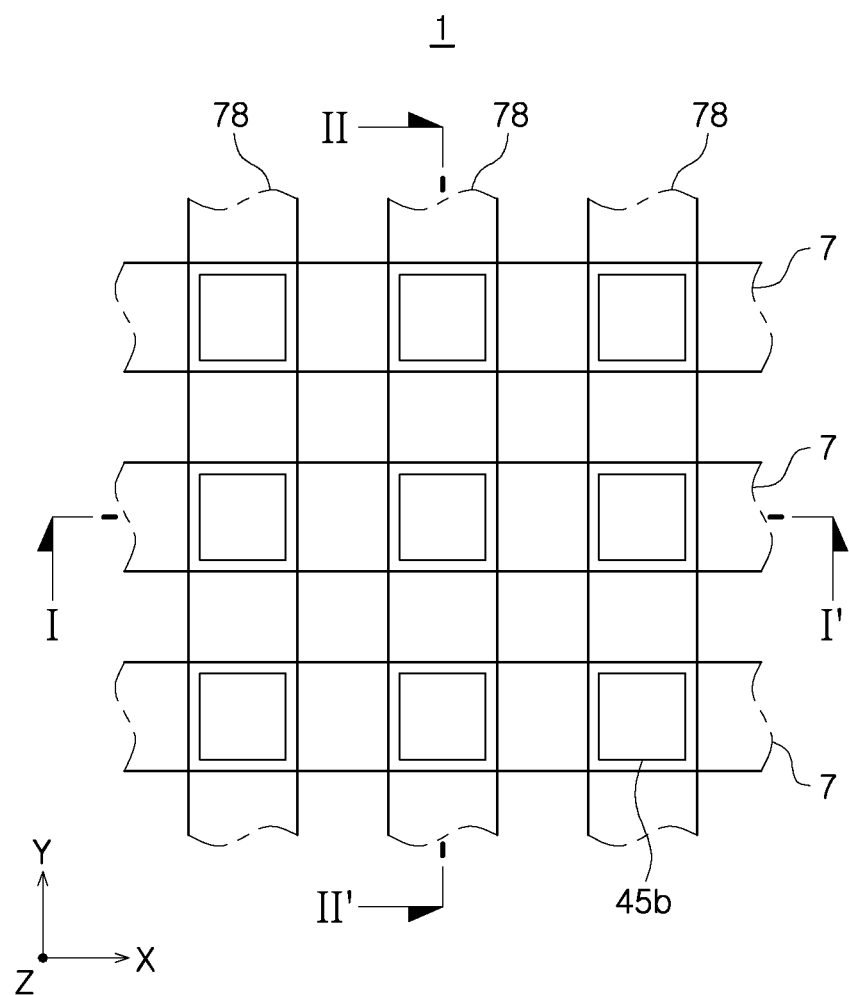
FIG. 2 is a top plan view of a semiconductor device according to an exemplary embodiment of the present inventive concepts.

Hereinafter, a method for manufacturing a semiconductor device 1 according to exemplary embodiments of the present inventive concepts will be described with reference to FIGS. 2 to 10. FIG. 2 is a top plan view of a semiconductor device according to an exemplary embodiment of the present inventive concepts. FIGS. 3, 4, 6-8 and 10 are cross-sectional views, taken along lines I-I' and II-II' of FIG. 2, illustrating a method for manufacturing a semiconductor device according to exemplary embodiments of the present inventive concepts. FIGS. 5 and 9 are cross-sectional views taken along lines I-I' and II-IF of FIG. 2 and a magnified view illustrating a method for manufacturing a semiconductor device according to exemplary embodiments of the present inventive concepts. In the description made with reference to FIGS. 2 to 10, contents already provided in FIG. 1 will be omitted. Accordingly, while the method for manufacturing a semiconductor device according to an exemplary embodiment is described with reference to FIGS. 2 to 10, omitted or briefly mentioned contents may be understood from the contents described with reference to FIG. 1.

Figure 3:
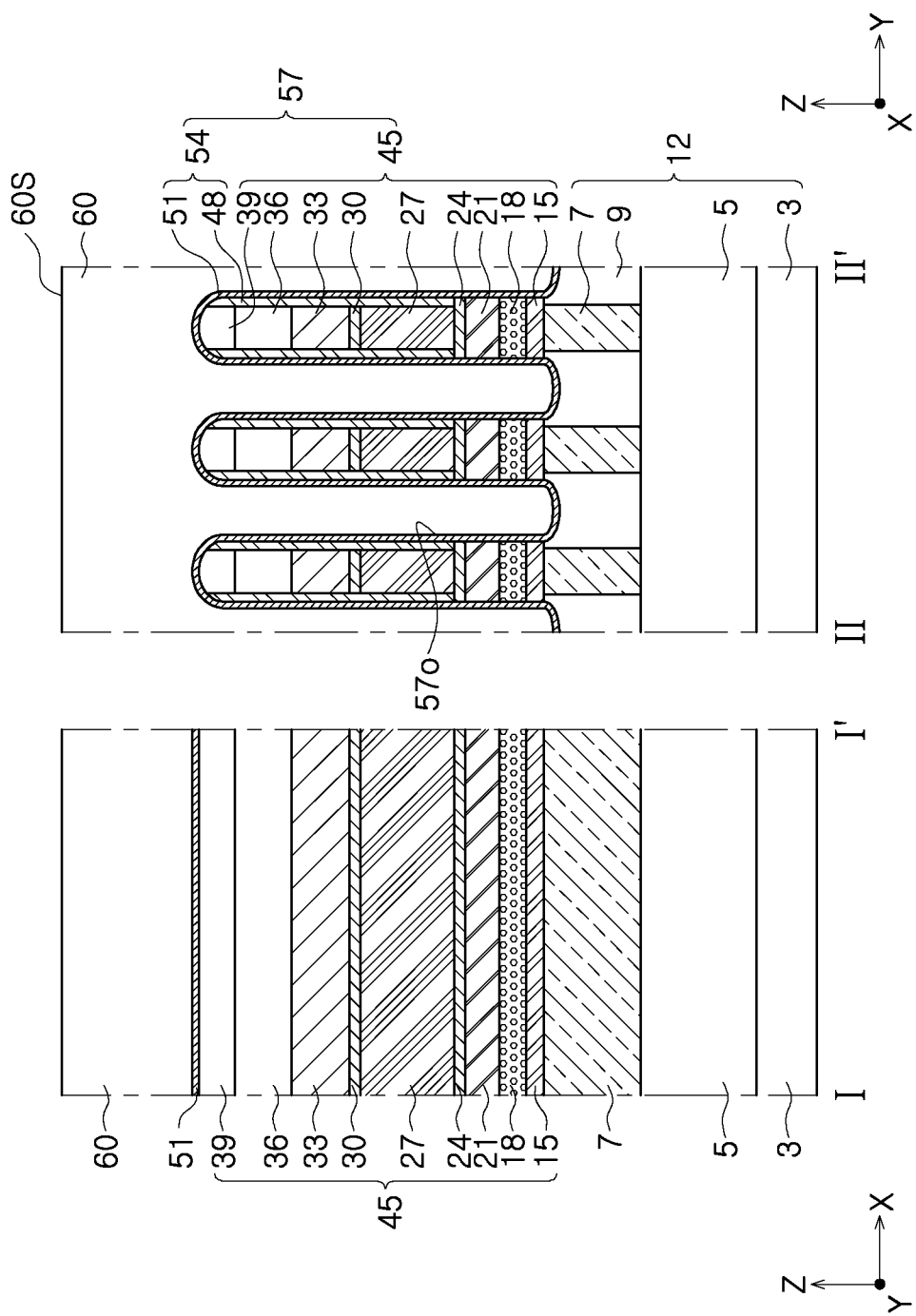
FIGS. 3, 4, 6-8 and 10 are cross-sectional views taken along lines I-I' and II-II' of FIG. 2 illustrating a method for manufacturing a semiconductor device according to exemplary embodiments of the present inventive concepts.

Referring to FIGS. 2 and 3, a first pattern structure 57 having a first opening 57o may be formed on a lower structure 12 including a semiconductor substrate 3. For example, as shown in the exemplary embodiment of FIG. 3, the first opening 57o may include a plurality of openings that are spaced apart in the Y direction. The Y direction may be parallel to an upper surface of the semiconductor substrate 3.

The lower structure 12 may include a lower insulating layer 5 on the semiconductor substrate 3, lower conductive lines 7 on the lower insulating layer, and a gap-fill insulating pattern 9 between the lower conductive lines 7 (e.g., in the Y direction). For example, as shown in the exemplary embodiment of FIG. 3, a bottom surface of the lower insulating layer 5 may directly contact an upper surface of the semiconductor substrate 3 and bottom surfaces of the lower conductive lines 7 and the gap-fill insulating pattern 9 may directly contact a top surface of the lower insulating layer 5. In an exemplary embodiment, the lower conductive lines 7 may be word lines of a memory device. However, exemplary embodiments of the present inventive concepts are not limited thereto. In an exemplary embodiment, the lower conductive lines 7 may include a conductive material such as tungsten. As shown in the exemplary embodiment of FIG. 2, the lower conductive lines 7 may have a line shape extending in the X direction. The X direction may be a direction parallel to an upper surface of the semiconductor substrate 3 and perpendicular to the Y direction.

The first pattern structure 57 may include a stacked pattern 45 and a first spacer layer 54. The first spacer layer 54 may cover at least one lateral side surface of the stacked pattern 45 (e.g., in the X direction). For example, as shown in the exemplary embodiment of FIG. 3, the first spacer layer 54 covers each of the lateral side surfaces of the stacked pattern 45.

The stacked pattern 45 may include a plurality of material layers. For example, as shown in the exemplary embodiment of FIG. 3, the stacked pattern 45 may include a lower electrode layer 15, a selector material layer 18, a single or a plurality of intermediate electrode layers, a data storage material layer 27, a single or a plurality of upper electrodes, and a single or a plurality of mask layers. For example, as shown in the exemplary embodiment of FIG. 3, the lower electrode layer 15, the selector material layer 18, the intermediate electrode layers, the data storage material layer 27, the upper electrodes, and the mask layers may be sequentially stacked on the lower structure 12 in the Z direction which is perpendicular to the upper surface of the semiconductor substrate 3 and perpendicular to the X direction and the Y direction.

The single or plurality of intermediate electrode layers may include a first intermediate electrode material layer 21 and a second intermediate electrode material layer 24 disposed on the first intermediate electrode material layer 21 (e.g., in the Z direction). The single or plurality of upper electrode layers may include a first upper electrode material layer 30 and a second upper electrode material layer 33 disposed on the first upper electrode material layer 30 (e.g., in the Z direction). The single or plurality of mask layers may include a first mask layer 36 and a second mask layer 39 disposed on the first mask layer 36 (e.g., in the Z direction).

The first spacer layer 54 may include a plurality of spacer layers. For example, the first spacer layer 54 may include a first internal spacer layer 48 and a first external spacer layer 51. The first internal spacer layer 48 and the first external spacer layer 51 may extend substantially in the Z direction. The first external spacer layer 51 may be disposed on the first internal spacer layer 48 (e.g., in the Y direction) and may cover an outwardly-facing longitudinal surface of the first internal spacer layer. A top portion of the first external spacer layer 51 may extend substantially in the Y direction and may cover a top surface of the second mask layer 39. A bottom portion of the first external spacer layer 51 may line a bottom portion (e.g., in the Z direction) of the opening 57o.

In an exemplary embodiment, forming the first pattern structure 57 may include sequentially forming (e.g., in the Z direction) the lower electrode layer 15, the selector material layer 18, the single or plurality of intermediate electrode layers, the data storage material layer 27, the single or plurality of upper electrode layers, the first mask layer 36 and the second mask layer 39 on the lower structure 12. The second mask layer 39, the first mask layer 36, the single or plurality of upper electrode layers 30 and 33, and the data storage material layer 27 are then sequentially etched. The first internal spacer layer 48 is formed on side surfaces of the etched second mask layer 39, the etched first mask layer 36, the etched single or plurality of upper electrode layers, and the etched data storage material layer 27. The single or plurality of intermediate electrode layers 21 and 24, the selector material layer 18, and the lower electrode layer 15 are etched using the second mask layer 39 and the first internal spacer layer 48 as etching masks. The first external spacer layer 51 is then conformally formed over the first pattern structure 57 and in the first opening 57o.

In an exemplary embodiment, the data storage material layer 27 may be formed of a phase change material. For example, the data storage material layer 27 may be formed of a chalcogenide-based phase change material having a phase changeable from a high-resistivity amorphous phase to a low-resistivity crystal phase, and vice versa, depending on heating temperature and time by an applied current. For example, the data storage material layer 27 may be formed of a phase change material such as a chalcogenide material including at least one compound selected from Ge, Sb, and Te. Alternatively, the data storage material layer 27 may be formed of a phase change material including at least one compound selected from Te and Se and at least one compound selected from Ge, Sb, Bi, Pb, Sn, As, S, Si, P, 0, N, and In. In another exemplary embodiment, the data storage material layer 27 may be formed of a data storage material that stores data in a different manner than a phase change material.

In an exemplary embodiment, the data storage material layer 27 may be formed to be amorphous in an initial formation operation.

The selector material layer 18 may constitute a switching device. In an exemplary embodiment, the selector material layer 18 may constitute an ovonic threshold switching device. For example, the selector material layer 18 may be formed of a chalcogenide-based material different from the chalcogenide-based material of the data storage material layer 27. The data storage material layer 27 may be a phase change memory material (such as an alloy of Ge, Sb and/or Te, or the like) having a phase changeable from a crystalline phase to an amorphous phase, and vice versa, during operation of a semiconductor device. The selector material layer 18 may be formed of a chalcogenide-based ovonic threshold switch material that maintains an amorphous phase during operation of the semiconductor device. For example, the selector material layer 18 may be formed of an alloy material including at least two elements selected from an As element, a S element, a Se element, a Te element, and a Ge element or an additional element (e.g., a Si element, a N element, or the like), capable of maintaining an amorphous phase at a higher temperature, added to such an alloy material. Alternatively, the selector material layer 18 may be formed of any one of an alloy material including Te, As, Ge and Si, an alloy material including Ge, Te and Pb, an alloy material including Ge, Se and Te, an alloy material including Al, As and Te, Se, As, an alloy material including Ge and Si, alloy materials including Se, As, Ge and C, an alloy material including Se, Te, Ge and Si, an alloy material including Ge, Sb, Te and Se, Ge, an alloy material including Bi, Te and Se, an alloy material including Ge, As, Sb and Se, an alloy materials including Ge, As, Bi and Te, and an alloy material including Ge, As, Bi and Se. However, exemplary embodiments of the present inventive concepts are not limited thereto.

In an exemplary embodiment, the lower electrode layer 15 and the first intermediate electrode material layer 21 may be formed of a carbon layer or a carbon-containing material layer. The carbon-containing material layer may be a material layer including carbon and a metal. For example, the carbon-containing material layer may include carbon as well as at least one metal such as W, Ti, or the like. However, exemplary embodiments of the present inventive concepts are not limited thereto.

In an exemplary embodiment, the second intermediate electrode material layer 24 and the first upper electrode material layer 30 may be formed of a metal. For example, the second intermediate electrode material layer 24 and the upper electrode material layer 30 may be formed of tungsten.

In an exemplary embodiment, the second upper electrode material layer 33 may be formed of carbon layer or a carbon-containing material layer.

The first internal spacer layer 48 and the first external spacer layer 51 may be formed of an insulating material.

In an exemplary embodiment, the first internal spacer layer 48 and the first external spacer layer 51 may be formed of insulating materials different from each other. For example, the first internal spacer layer 48 may be formed of at least one compound selected from SiN, $SiO_2$, SiC, SiCN, SiON, SiBN, and SiOCN, and the first external spacer layer 51 may be formed of a material, different from the material of the first internal spacer layer 48, among SiN, $SiO_2$, SiC, SiCN, SiON, SiBN, and SiOCN. However, exemplary embodiments of the first internal spacer layer 48 and the first external spacer layer 51 are not limited to such materials, and materials of the first internal spacer layer 48 and the first external spacer layer 51 may be replaced with other materials.

In another exemplary embodiment, the first internal spacer layer 48 and the first external spacer layer 51 may be formed of the same insulating material.

A first flowable material layer 60 may be formed on the first spacer layer 54 to cover an upper portion of the first pattern structure 57 and filling the first opening 57o. The first flowable material layer 60 may have an upper surface 60S that is disposed on a level (e.g., distance in the Z direction from a top surface of the semiconductor substrate 3) that is higher than a level of an upper surface of the first pattern structure 57.

The first flowable material layer 60 may be the same as the flowable material layer described with reference to FIG. 1. Therefore, since the first flowable material layer 60 may be formed using the same method as described with reference to FIG. 1, a detailed description thereof will be omitted.

Figure 4:
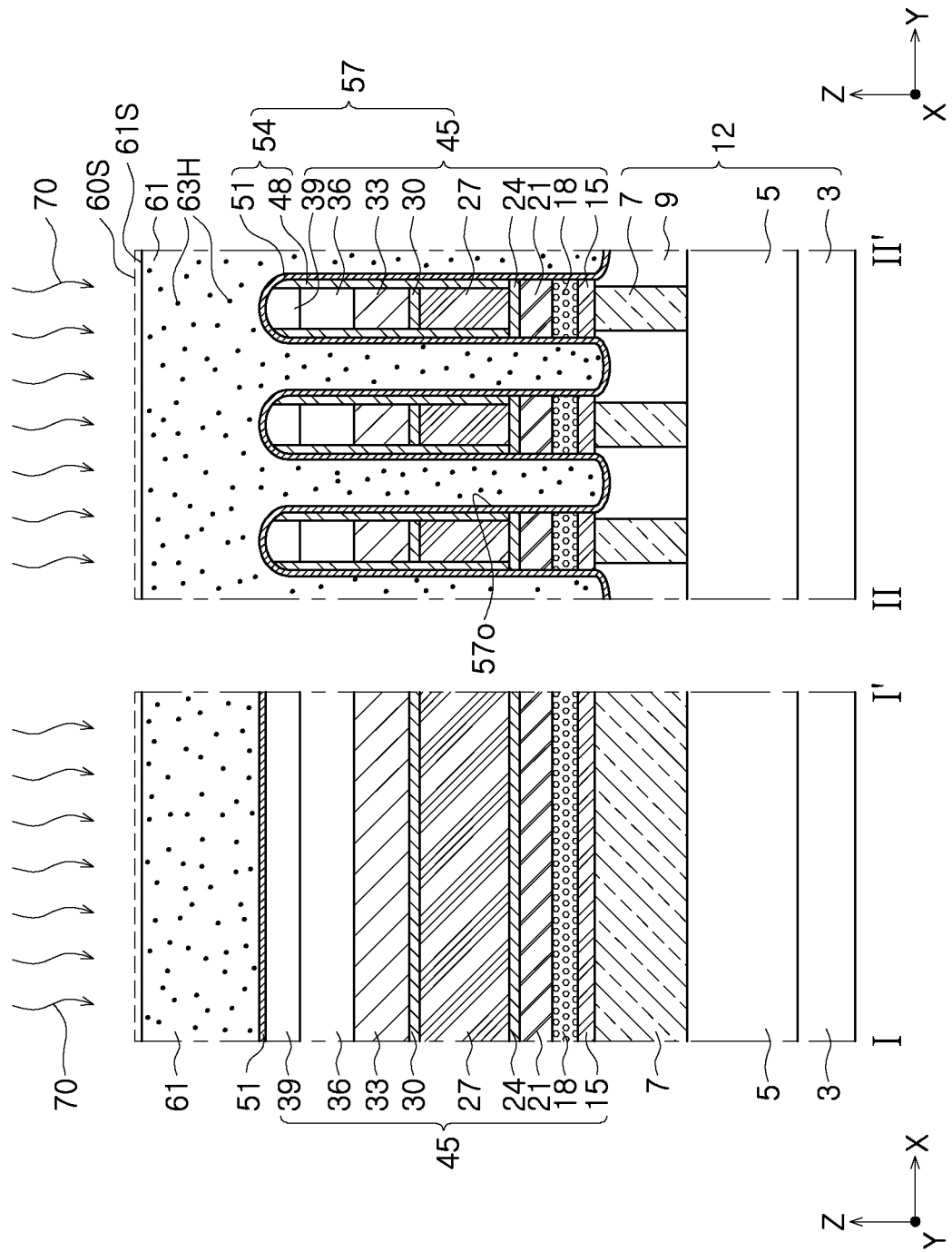
Figure 5:
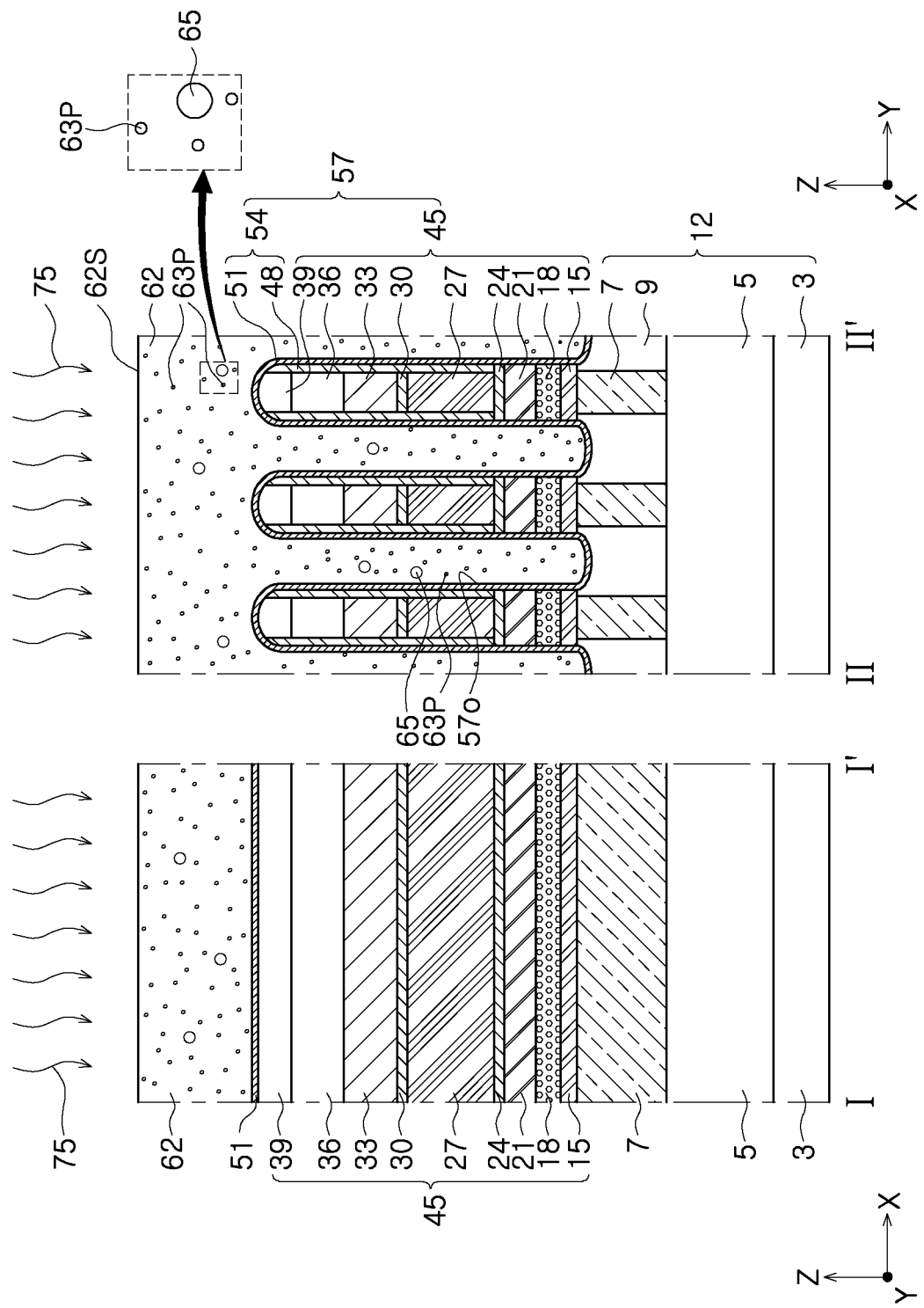
FIGS. 5 and 9 are cross-sectional views taken along lines I-I' and II-II' of FIG. 2 and a magnified view illustrating a method for manufacturing a semiconductor device according to exemplary embodiments of the present inventive concepts.

Referring to FIGS. 2 and 4, a first curing process 70 may be performed to cure the first flowable material layer (60 in FIG. 3) to form a first cured material layer 61 including water 63H.

The performing of the first curing process 70 to form the first cured material layer 61 may include curing the first flowable material layer 60 to prevent water ($H_2O$) 63H from being evaporated outwardly of the first flowable material layer 60 while supplying a gaseous ammonia ($NH_3$) catalyst into the first flowable material layer 60 to generate the water 63H in the first flowable material layer. Therefore, the first cured material layer 61 may include the water 63H.

The first cured material layer 61 is formed by performing the first curing process 70 on the first flowable material layer 60. A volume of the first cured material layer 61 may be reduced by the performing of the first curing process 70. Therefore, an upper surface 61S of the first cured material layer 61 may be lower (e.g., in the Z direction) than the upper surface 60S of the first flowable material layer 60 prior to the performing of the first curing process 70. The broken line in FIG. 4 represents the level of the upper surface 60S of the first flowable material layer prior to performing the first curing process 70.

The first curing process 70 may be the same as the first curing process described in FIG. 1, and the first cured material layer 61 may be the same as the cured material layer described in FIG. 1. Therefore, since the first curing process 70 and the first cured material layer 61 may be understood from the contents described with reference to FIG. 1, detailed descriptions thereof will be omitted.

Referring to FIGS. 2 and 5, a second curing process 75 may then be performed on the first cured material layer 61 to form the first low-k dielectric material layer 62. Water 63H is evaporated outwardly from the first cured material layer 61 when performing the second curing process 75.

In an exemplary embodiment, the first low-k dielectric material layer 62 may have first pores 63P.

As shown in the magnified view of FIG. 5, the first low-k dielectric material layer 62 may further have second pores 65 that are larger than the first pores 63P. Accordingly, the first low-k dielectric material layer 62 may have the first and second pores 63P and 65 having sizes that are different from each other.

In the drawings, the sizes of the first pores 63P and the second pores 65 may be exaggerated for clarity of description.

In an exemplary embodiment, when the first curing process 70 is performed on the first flowable material layer 60 and the second curing process 75 is performed on the cured material layer 61 to form the first low-k dielectric material layer 62, the volume reduction rate may be about 2% or less. For example, the volume reduction rate may be about 1% or less when the first curing process 70 and the second curing process 75 are performed to form the first low-k dielectric material layer 62 from the first flowable material layer 60.

The volume reduction rate when the first curing process 70 is performed on the first flowable material layer 60 to form the first cured material layer 61 may be greater than the volume reduction rate when the second curing process 75 is performed on the first cured material layer 61 to form the first low-k dielectric material layer. For example, a difference in height between the upper surface of the first flowable material layer 60 and the upper surface 61S of the first cured material layer 61 may be greater than a difference in height between an upper surface 62S of the first low-k dielectric material layer 62 and the upper surface 61S of the first cured material layer 61.

According to exemplary embodiments, when the first curing process 70 and the second curing process 75 are performed to form the first low-k dielectric material layer 62 from the first flowable material layer 60, the volume reduction rate may be significantly reduced to prevent peeling between a side surface of the second upper electrode material layer 33, which may contain carbon, and the first spacer layer 54 and to prevent a reduction in an interfacial bonding force between the side surface of the second upper electrode material layer 33 and the first spacer layer 54.

Figure 6:
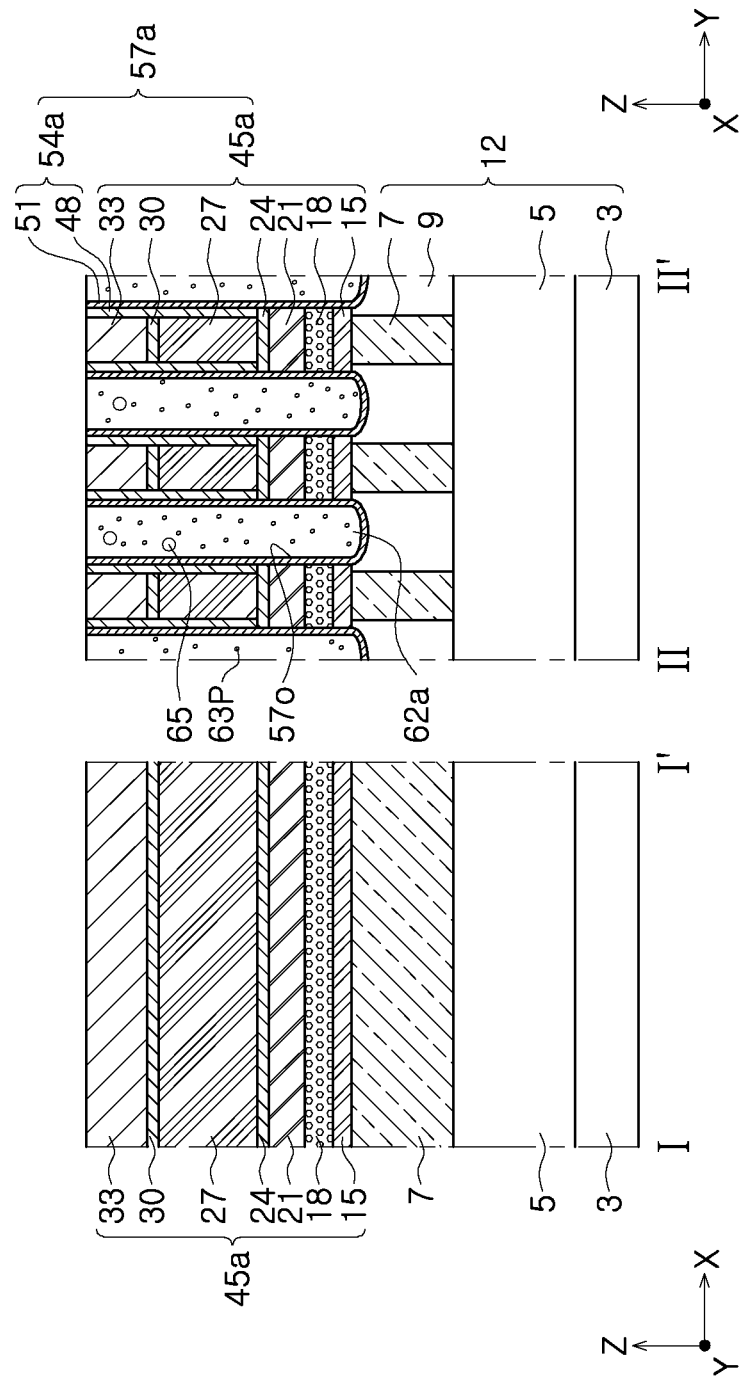

Referring to FIGS. 2 and 6, the first low-k dielectric material layer 62 may be planarized by a first planarization process to form a planarized first low-k dielectric material layer 62a.

In an exemplary embodiment, the first planarization process may be a chemical mechanical polishing (CMP) process.

As shown in the exemplary embodiment of FIG. 6, when the first low-k dielectric material layer 62 is planarized by the first planarization process, the first pattern structure 57 may also be planarized to form a planarized first pattern structure 57a. The second upper electrode material layer 33 of the first pattern structure may be exposed by the first planarization process and the single or plurality of mask layers 36 and 39 disposed on the second upper electrode material layer 33 may be removed by the first planarization process.

The first planarization process may planarize the first stacked pattern 45 to form a planarized first stacked pattern 45a exposing the upper surface of the second upper electrode material layer 33. The first spacer layer 54 may be planarized by the first planarization process to form a planarized first spacer layer 54a. Accordingly, the planarized first pattern structure 57a may include the planarized first stacked pattern 45a and the planarized first spacer layer 54a.

A portion of the planarized first spacer layer 54a, interposed between the planarized first low-k dielectric material layer 62a and the second upper electrode material layer 33 (e.g., in the Y direction), may include the first internal spacer layer 48 and the first external spacer layer 51.

Since the first curing process 70 and the second curing process 75 may be performed to significantly reduce a volume reduction occurring when the first flowable material layer is formed as the rigidly cured first low-k dielectric material layer 62, the first stacked pattern 45 and the first spacer layer 54a may be prevented from being peeled by the first planarization process.

Figure 7:
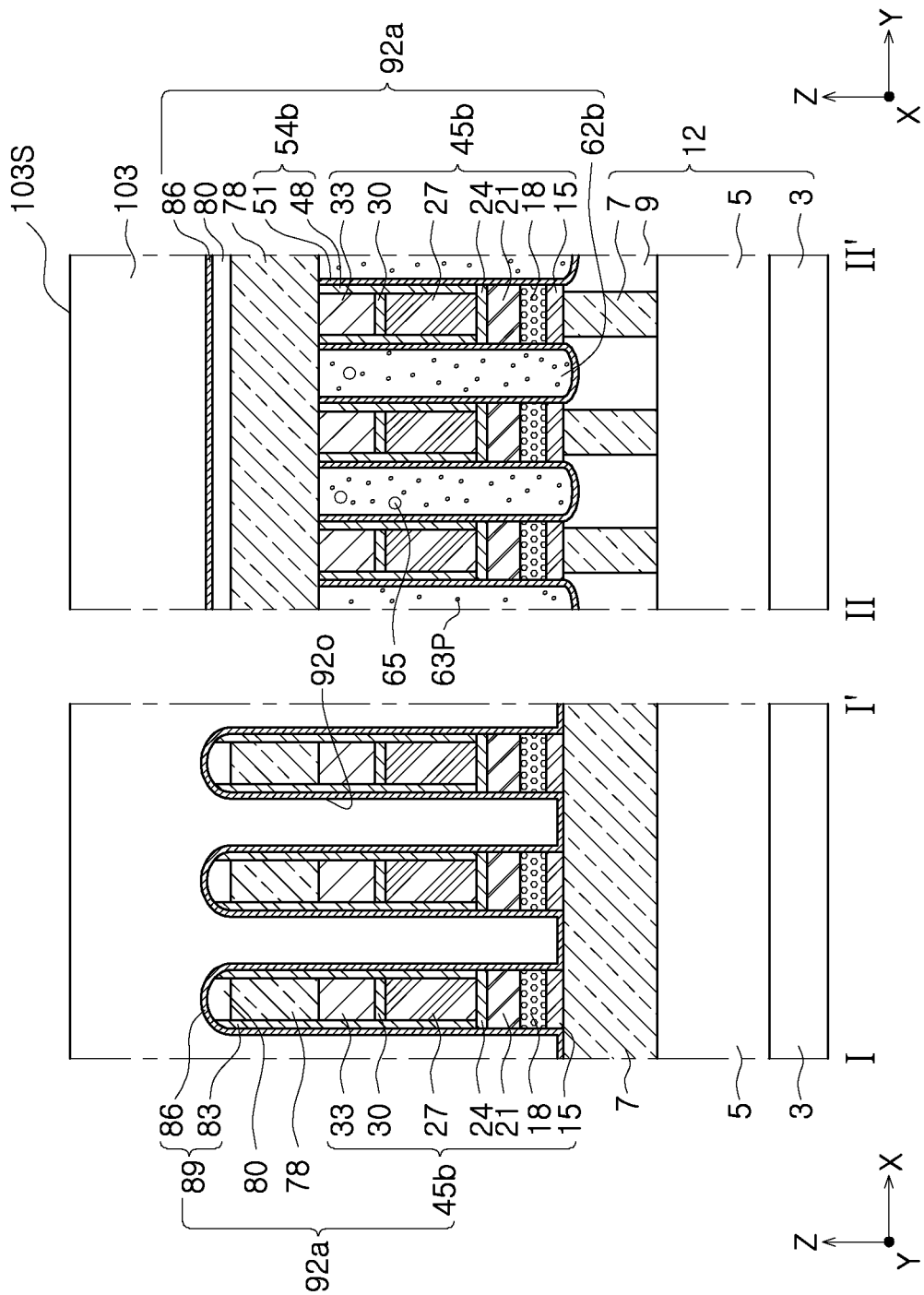

Referring to FIGS. 2 and 7, an upper conductive line 78 and an upper mask line 80 may be formed to be sequentially stacked on the planarized first pattern structure 57a and the planarized first low-k dielectric material layer 62a in FIG. 6. For example, as shown in the exemplary embodiment of FIG. 7, a bottom surface of the upper conductive line 78 may directly contact top surfaces of the planarized first pattern structure 57a and the planarized first low-k dielectric material layer 62a.

As shown in the exemplary embodiment of FIG. 2, the upper conductive line 78 may have a line shape extending in the Y direction.

A second pattern structure 92a having a second opening 92o may be formed by etching the planarized first pattern structure 57a and the planarized first low-k dielectric material layer 62a by an etching process that uses the upper conductive line 78 and the upper mask line 80 as etching masks. For example, as shown in the exemplary embodiment of FIG. 7, the second opening 92o may include a plurality of openings that are spaced apart in the X direction. A second spacer layer 89 may then be formed to extend over the lateral surfaces and a top surface of the second pattern structure 92a and in the second opening 92o.

The planarized first pattern structure 57a and the planarized first low-k dielectric material layer 62a may be formed as patterned first pattern structures and a first low-k dielectric material layer 62b, respectively, by the etching process that uses the upper conductive line 78 and the upper mask line 80 as etching masks. The patterned first pattern structures may include a second stacked pattern 45b formed by patterning the planarized first stacked pattern 45a and a patterned first spacer layer 54b formed by patterning the planarized first spacer layer 54a. The second spacer layer 89 may cover at least side surfaces of the first pattern structures.

The second pattern structure 92a may include the patterned first pattern structures, the first low-k dielectric material layer 62b, the upper conductive line 78, the upper mask line 80, and the second spacer layer 89.

The second stacked pattern 45b may be formed to include substantially the same layers, such as the lower electrode layer 15, the selector material layer 18, the first intermediate electrode material layer 21, the second intermediate electrode material layer 24, the first upper electrode material layer 30, and the second upper electrode material layer 33 as the layers of the planarized first stacked pattern 45a.

The second spacer layer 89 may include a second internal spacer layer 83 and a second external spacer layer 86. As shown in the exemplary embodiment of FIG. 7, the second external spacer layer 86 may be disposed on the second internal spacer layer 83 in the X direction.

In an exemplary embodiment, the second internal spacer layer 83 and the second external spacer layer 86 may be formed of insulating materials different from each other. For example, the second internal spacer layer 83 may be formed of at least one compound selected from SiN, $SiO_2$, SiC, SiCN, SiON, SiBN, and SiOCN, and the second external spacer layer 86 may be formed of a material that is different from the material of the second internal spacer layer 83 among SiN, $SiO_2$, SiC, SiCN, SiON, SiBN, and SiOCN. However, exemplary embodiments of the present inventive concepts are not limited to such materials, and in other exemplary embodiments the materials of the second internal spacer layer 83 and the second external spacer layer 86 may be replaced with other materials.

In another exemplary embodiment, the second internal spacer layer 83 and the second external spacer layer 86 may be formed of the same insulating material.

Forming the second spacer layer 89 may include forming the second internal spacer layer 83 to cover lateral side surfaces of the second upper electrode material layer 33, the first upper electrode material layer 30, the data storage material layer 27, the upper conductive line 78, and the upper mask line 80 after etching the second upper electrode material layer 33, the first upper electrode material layer 30, and the data storage material layer 27 of the planarized first pattern structure 57a using the upper conductive line 78 and the upper mask line 80 as etching masks.

Forming the second spacer layer 89 may include etching the single or plurality of intermediate electrode layers 21 and 24, the selector material layer 18, and the lower electrode layer 15 using the second internal spacer layer 83 and the upper mask line 80 as etching masks and conformally forming the second external spacer layer 86 after forming the second internal spacer layer 83. The second external spacer layer 86 may cover side surfaces of the single or plurality of intermediate electrode layers 21 and 24, the selector material layer 18, and the lower electrode layer 15, an external side surface of the second internal spacer layer 83 (e.g., in the X direction) and an upper surface of the upper mask line 80, and upper surfaces of the lower conductive lines 7 adjacent to the lower electrode layer 15 (e.g., in the Z direction).

A second flowable material layer 103 may be formed on the second spacer layer 89 to cover an upper portion of the second pattern structure 92a while filling the second opening 92o. For example, as shown in the exemplary embodiment of FIG. 7, a bottom surface of the second flowable material layer 103 may directly contact a top surface of the second pattern structure 92a. In an exemplary embodiment, the second flowable material layer 103 may be formed by the same method and formed of the same material as the first flowable material layer 60 described above.

Figure 8:
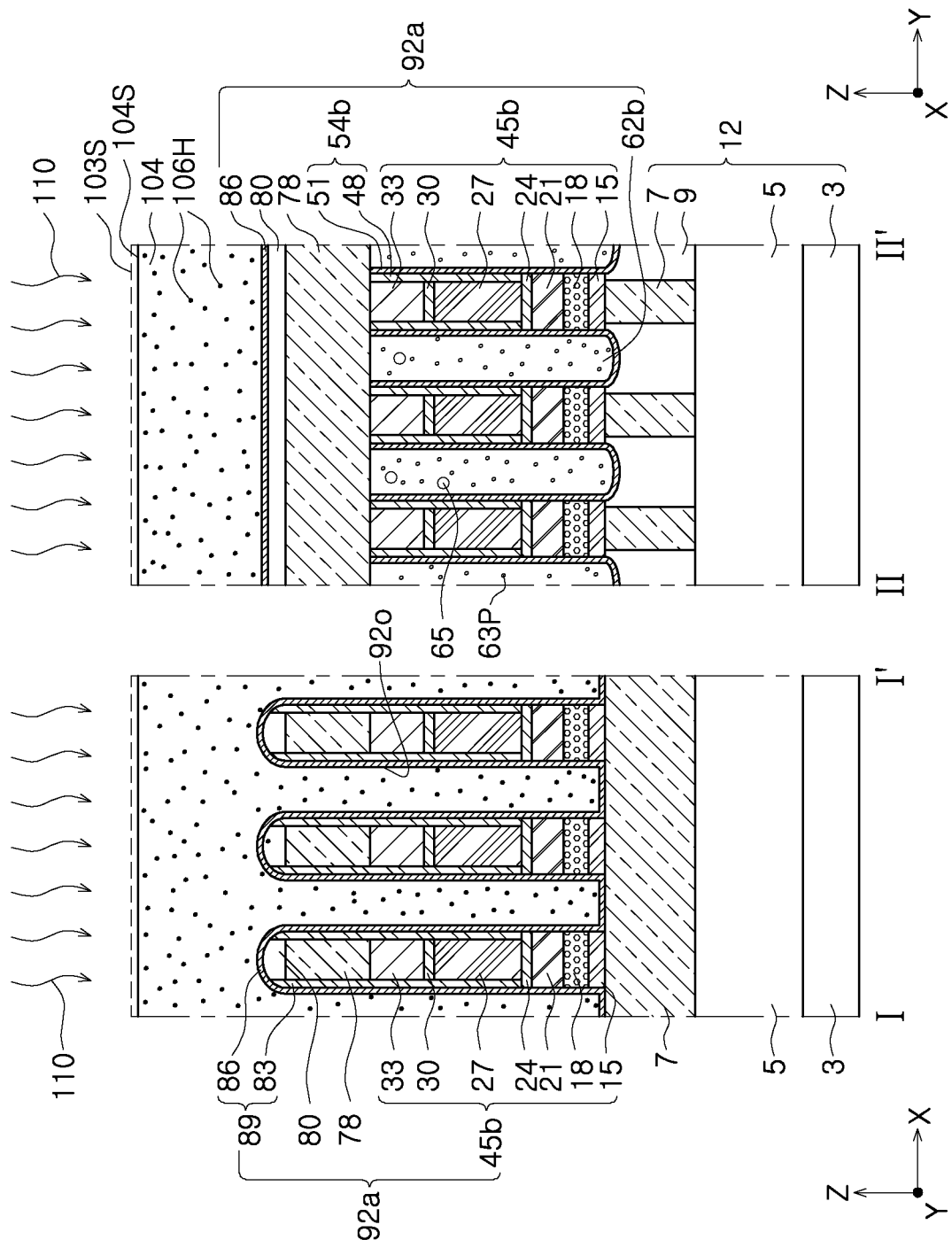
Figure 9:
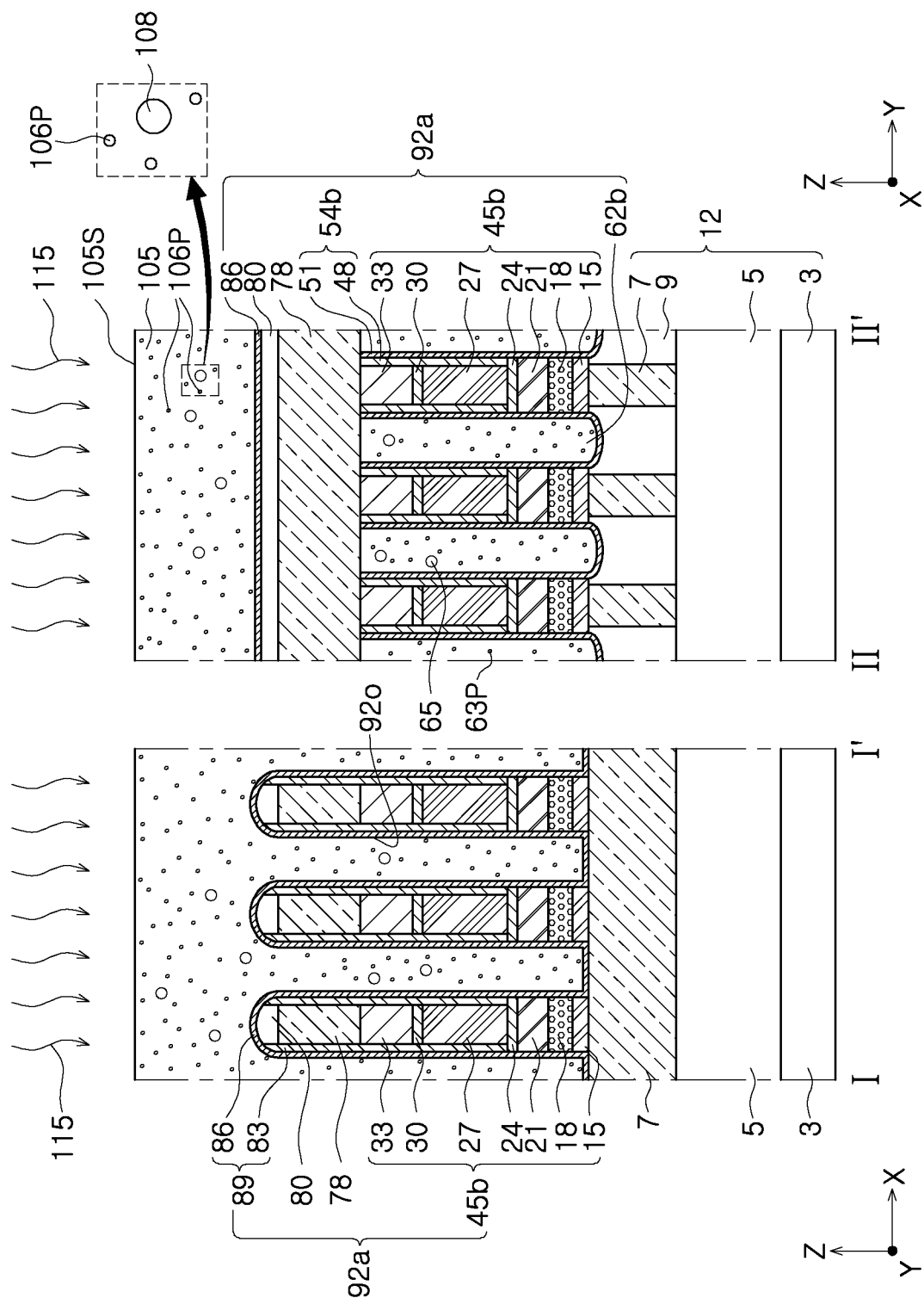

Referring to FIGS. 2 and 8, a third curing process 110 may be performed on the second flowable material layer 103 to form a second cured material layer 104 that including water 106H. In an exemplary embodiment, the third curing process 110 may be substantially the same process as the first curing process 70 described in FIG. 4, and the second cured material layer 104 may be substantially the same as the first cured material layer 61 described in FIG. 4. Accordingly, since the third curing process 110 and the second cured material layer 104 may be easily understood from the first curing process 70 and the first cured material layer 61, detailed description thereof will be omitted.

Referring to FIGS. 2 and 9, a fourth curing process 115 may be performed on the second cured material layer 104 to form a second low-k dielectric material layer 105 while evaporating the water 106H in the second cured material layer 104 outwardly of the second cured material layer 104.

In an exemplary embodiment, the second low-k dielectric material layer 105 may have a third pore 106P and a fourth pore 108, respectively corresponding to the first pore 63P and the second pore 65 of the first low-k dielectric material layer 62 described above.

In an exemplary embodiment, when the third curing process 110 and the fourth curing process 115 are performed on the second flowable material layer 103 to form the second low-k dielectric material layer 105, the volume reduction rate may be about 2% or less. For example, the volume reduction rate may be about 1% or less when the third curing process 110 and the fourth curing process 115 are performed on the second flowable material layer to form the second low-k dielectric material layer 105.

The volume reduction rate when the third curing process 110 is performed on the second flowable material layer 103 to form the second cured material layer 104 may be greater than the volume reduction rate when the fourth curing process 115 is performed on the cured material layer 104 to form the second low-k dielectric material layer 105. For example, a difference in height between the upper surface 103S of the second flowable material layer and the upper surface of the second cured material layer may be greater than a difference in height between the upper surface 105S of the second low-k dielectric material layer 105 and the upper surface 104S of the second cured material layer.

The fourth curing process 115 may be substantially the same as the above-described second curing process (75 in FIG. 5), and the second low-k dielectric material layer 105 may be substantially the same as the first low-k dielectric material layer (62 in FIG. 5). Accordingly, since the fourth curing process 115 and the second low-k dielectric material layer 105 may be easily understood from the second curing process (75 in FIG. 5) and the first low-k dielectric material layer 62 described in FIG. 5, detailed descriptions thereof will be omitted.

Figure 10:
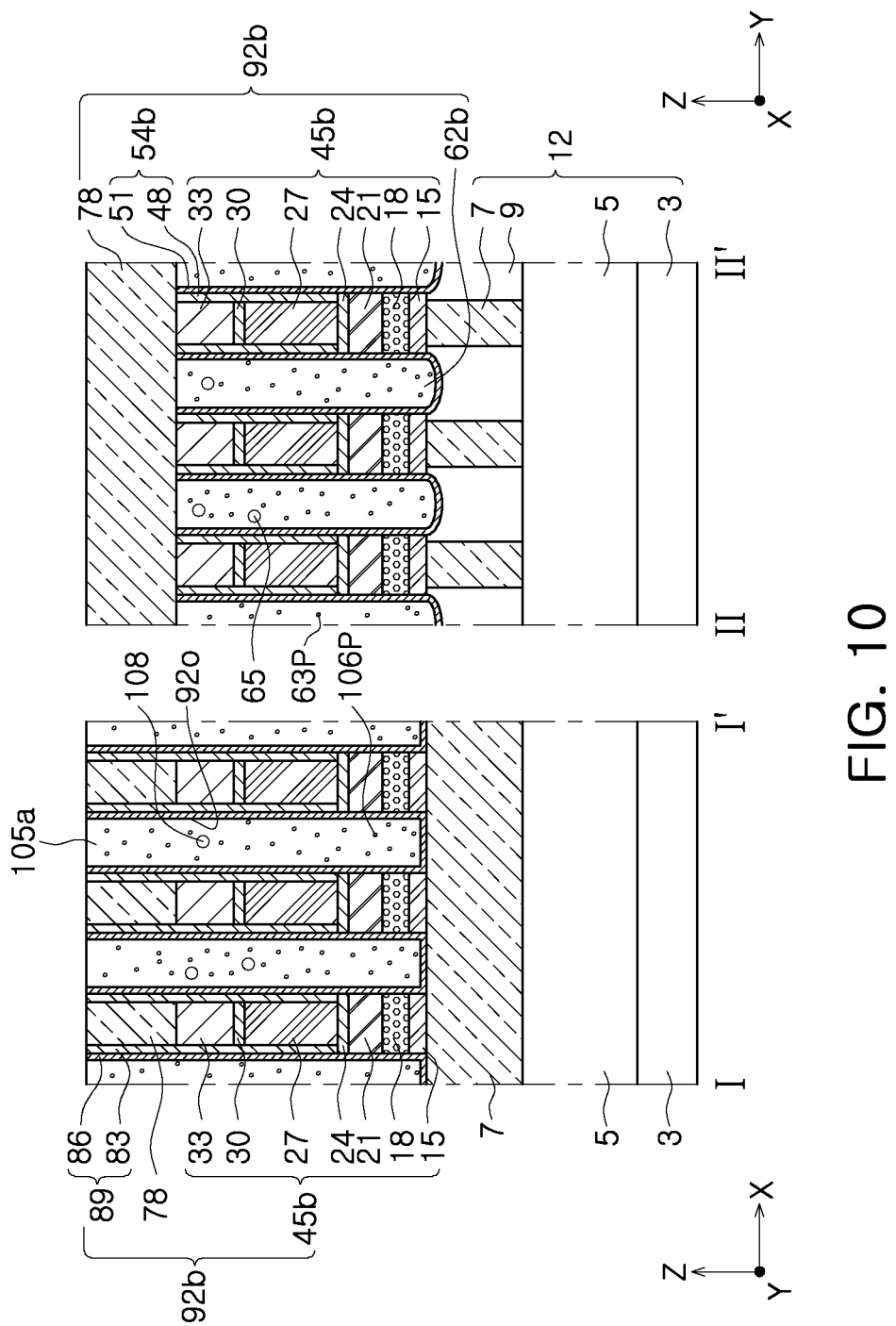

Referring to FIGS. 2 and 10, the second low-k dielectric material layer (105 in FIG. 9) may be planarized by a second planarization process to form a planarized second low-k dielectric material layer 105a.

In an exemplary embodiment, the second planarization process may be a chemical mechanical polishing (CMP) process. However, exemplary embodiments of the present inventive concepts are not limited thereto.

While the second low-k dielectric material layer 105 is planarized by the second planarization process, the second pattern structure 92a may also be planarized to form a planarized second pattern structure 92b. The upper conductive line 78 of the second pattern structure 92a may be exposed and the upper mask line 80 may be removed by the second planarization process.

Since the third curing process 110 and the fourth curing process 115 may be performed to significantly reduce a volume reduction occurring when the second flowable material layer 103 is formed as a rigidly cured second low-k dielectric material layer 105, the side surface of the second stacked pattern 45b and the second spacer layer 89 may be prevented from being peeled by the second planarization process. Accordingly, a defect rate of the semiconductor devices may be reduced and the productivity of the process may be improved.

According to exemplary embodiments of the present inventive concepts, a semiconductor device having a structure illustrated in FIG. 10, formed by a method for manufacturing a semiconductor device described with reference to FIGS. 1 to 10, may be provided. For example, the semiconductor device having a structure illustrated in FIG. 10 may include components formed by the method described above with reference to FIGS. 1 to 10. Therefore, the structure of the semiconductor device may be easily understood from the components formed by the method described with reference to FIGS. 1 to 10.

As described above, exemplary embodiments of the present inventive concepts may provide a method for manufacturing a semiconductor device while a flowable material layer is converted into a rigidly cured low-k dielectric material layer by sequentially performing a first curing process using an ammonia (NH3) catalyst gas and a second curing process at a temperature of about 100° C. or more. When the flowable material layer is converted into the low-k dielectric material layer, a volume reduction rate may 2% or less. Such a low-k dielectric material layer may be formed in an opening of a pattern structure. The pattern structure may include an electrode layer including carbon and a spacer layer covering side surfaces of the electrode layer. Since a volume reduction occurring when the flowable material layer is converted into the low-k dielectric material layer may be significantly reduced, a defect caused by peeling between the electrode layer and the spacer layer may be prevented. As a result, productivity of a semiconductor device may be improved.

While exemplary embodiments have been shown and described above, it will be apparent to those skilled in the art that modifications and variations could be made without departing from the scope of the present inventive concept as defined by the appended claims.

What is claimed is:

1. A method for manufacturing a semiconductor device, comprising:

forming a first pattern structure having a first opening on a lower structure comprising a semiconductor substrate, the first pattern structure comprising a stacked pattern and a first spacer layer covering at least a side surface of the stacked pattern;

forming a first flowable material layer on the first spacer layer to fill the first opening and cover an upper portion of the first pattern structure, the first flowable material layer including a SiOCH material;

performing a first curing process on the first flowable material layer to form a first cured material layer that includes water ($H_2O$), the performing of the first curing process comprises supplying a gaseous ammonia ($NH_3$) catalyst into the first flowable material layer, the first curing process is configured to cure the first flowable material layer while generating the water (H₂O) in the first flowable material layer;

performing a second curing process on the first cured material layer to form a first low-k dielectric material layer having a dielectric constant that is lower than a dielectric constant of silicon dioxide, the second curing process configured to evaporate the water (H₂O) in the first cured material layer outwardly of the first cured material layer; and planarizing the first low-k dielectric material layer using a first chemical mechanical polishing process to form a planarized first low-k dielectric material layer.

2. The method of claim 1, wherein:

the first curing process is, performed at a temperature of less than 100° C. at which the water (H₂O) that is generated in the first flowable material layer is not evaporated; and the second curing process is performed at a temperature of 100° C. or more at which the water (H₂O) in the first flowable material layer is evaporated outwardly of the first cured material layer.

3. The method of claim 2, wherein:

the stacked pattern comprises an electrode layer that includes a carbon layer or a carbon-containing material layer;

a first portion of the first spacer layer is formed between a lateral side surface of the electrode layer and the first flowable material layer; and the first portion of the first spacer layer comprises at least two layers.

4. The method of claim 3, wherein:

the stacked pattern further comprises an amorphous phase change material layer, and the temperature at which the second curing process is performed is configured to maintain an amorphous phase of the amorphous phase change material layer.

5. The method of claim 1, wherein a volume reduction rate when the first flowable material layer is formed as the first cured material layer by the first curing process is greater than a volume reduction rate when the first cured material layer is formed as the first low-k dielectric material layer by the second curing process.

6. The method of claim 1, wherein:

the first flowable material layer includes a SiOCH material formed using an octamethylcyclotetrasiloxane (OMCTS) as a precursor and using at least one compound selected from tetramethyl orthosilicate (TMOS) and tetraethyl orthosilicate (TEOS) as an additive; and the SiOCH material of the first flowable material layer has Chemical Formula 1:

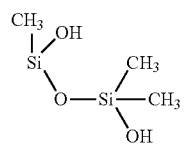

<Chemical Formula 1>

7. The method of claim 6, wherein:

the SiOCH material of the first flowable material layer forms a siloxane bond in the first curing process to form the first cured material layer; and the first cured material layer has Chemical Formula 2:

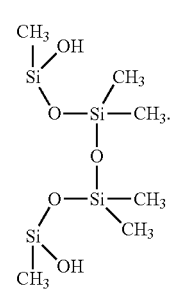

<Chemical Formula 2>

8. The method of claim 7, wherein:

hydrogen (H) of the first cured material layer is removed in the second curing process to form a SiOC material in the first low-k dielectric material layer; and the SiOC material of the first low-k dielectric material layer has Chemical Formula 3:

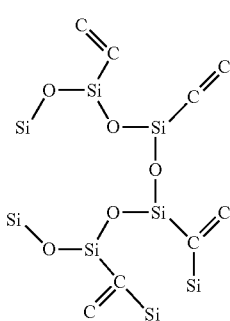

<Chemical Formula 3>

9. The method of claim 1, wherein:

a planarized first pattern structure is formed from the first pattern structure by performing the first chemical mechanical polishing process;

the method further comprising:

forming an upper conductive line and an upper mask line on the planarized first pattern structure and the planarized first low-k dielectric material layer, wherein the upper conductive line and the upper mask line are sequentially stacked on the planarized first pattern structure and die planarized first low-k dielectric material layer;

forming a second pattern structure having a second opening, wherein the forming of the second pattern structure comprises etching the planarized first pattern structure and the planarized first low-k dielectric material layer by an etching process using the upper conductive line and the upper mask line as etching masks, the planarized first pattern structure and the planarized first low-k dielectric material layer are etched to respectively form a patterned first pattern structure and a patterned first low-k dielectric material layer, and forming a second spacer layer covering at least a side surface of the patterned first pattern structure;

forming a second flowable material layer to fill the second opening and cover an upper portion of the second pattern structure, the second flowable material layer is formed of the same material as the first flowable material layer;

performing a third curing process on the second flowable material layer to form a second cured material layer that includes water (H$_2$O), the performing of the third curing process comprises supplying a gaseous ammonia (NH$_3$) catalyst into the second flowable material layer, the third curing process configured to cure the second flowable material layer while generating the water (H$_2$O) in the second flowable material layer and preventing the water (H$_2$O) from being evaporated outwardly of the second flowable material layer;

performing a fourth curing process on the second cured material layer to form a second low-k dielectric material layer, the fourth curing process configured, to evaporate the water (H$_2$O) in the second cured material layer outwardly of the second cured material layer; and planarizing the second low-k dielectric material layer using a second chemical mechanical polishing process to form a planarized second low-k dielectric material layer.

10. The method of claim 9, wherein the lower structure further comprises a lower insulating layer on the semiconductor substrate, lower conductive lines on the lower insulating layer, and a gap-fill insulating pattern between the lower conductive lines, wherein the lower conductive lines extend in a first direction that is parallel to an upper surface of the semiconductor substrate, and wherein the upper conductive line extends in a second direction that is parallel to the upper surface of the semiconductor substrate and perpendicular to the first direction.

11. The Method of claim 1, wherein:

the stacked pattern comprises a lower electrode layer, a selector material layer, a first intermediate electrode material layer, a second intermediate electrode material layer, a data storage material layer, a first upper electrode material layer, and a second upper electrode material layer stacked sequentially on the lower Structure; and the first spacer layer comprises:
  an internal spacer covering lateral side surfaces of each of the data storage material layer, the first upper electrode material layer, and the second upper electrode material layer; and
  an external spacer covering an external side surface of the internal spacer and extending downwardly to cover side surfaces of each of the second intermediate electrode material layer, the first intermediate electrode material layer, the selector material layer, and the lower electrode layer.

12. The method of claim 11, wherein:

the second upper electrode material layer is formed of a carbon layer or a carbon-containing material layer; and the internal spacer is in direct contact with a side surface of the second upper electrode material layer.

13. A method for manufacturing a semiconductor device, comprising:

forming a structure having t opening on a lower structure;

forming a flowable material layer to fill the opening and cover an upper portion of the structure;

performing a first curing process on the flowable material layer to forma cured material layer, wherein water (H$_2$O) is generated in the cured material the first curing process; and performing a second curing process on the cured material layer to form a low-k dielectric material layer having a dielectric constant that is lower than a dielectric constant of silicon dioxide, wherein the water (H$_2$O) is evaporated during the second curing process; and planarizing the low-k dielectric material layer to form a planarized low-k dielectric material layer in the opening, wherein a volume reduction rate when the flowable material is formed as the cured material layer is greater than a volume reduction are when the cured material layer is formed as the low-k dielectric material layer.

14. The method of claim 13, wherein a volume reduction rate when the tow able material layer is formed as the low-k dielectric material layer by the first curing process and the second curing process is about 2% or less.

15. The method of claim 13, wherein the structure comprises a pattern structure and a spacer layer on at least a side surface of the pattern structure, the pattern structure comprises an electrode layer that includes a carbon layer or a carbon-containing material layer, the spacer layer is in contact with a side surface of the electrode layer, and the low-k dielectric, material layer is in contact with an external side surface of the spacer layer.

16. The method of claim 15, wherein:

the spacer layer comprises an internal spacer layer and an external spacer layer;

the internal spacer layer covers a side surface of the pattern structure, the external spacer layer extends to a lower surface of the opening while covering the internal spacer layer and an upper surface of the pattern structure, and a portion of the external spacer layer, disposed on the pattern structure, is removed while planarizing the low-k dielectric material layer.

17. A method for manufacturing a semiconductor device, comprising:

forming a flowable material layer on a lower structure;

performing a first curing process by supplying an ammonia (NH$_3$) catalyst gas into the flowable material layer at a temperature in a range of about 23° C. to about 100° C. to form a cured material layer; and performing a second curing process at a temperature of 100° C. or more on the cured material layer to form low-k dielectric material layer having a dielectric constant that is lower than a dielectric constant of silicon dioxide, wherein the flowable material layer includes a SiOCH material, wherein water (H$_2$O) is generated during the first curing process, wherein the water (H$_2$O) generated during the first curing process is included in the cured material layer, wherein the water (H$_2$O) in the cured material layer is evaporated and removed during the second curing process, and wherein hydrogen (H) in the cured material layer is removed in the second curing process, to form the low-k dielectric layer of a SiOC material.

18. The method of claim 17, wherein:

the flowable material layer has Chemical Formula 1:

<Chemical Formula 1>

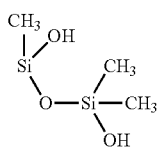

the cured material layer has Chemical Formula 2:

<Chemical Formula 2>

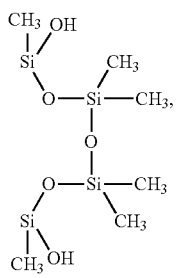

and the low-k dielectric, material layer has Chemical Formula 3:

<Chemical Formula 3>

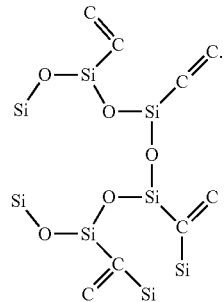

19. The method of claim 17, wherein the second curing process further comprises using at least one of an ultraviolet (UV) process and an ammonia catalyst process;

wherein the UV process comprises irradiating UV to a surface of the cured material layer, and wherein the ammonia catalyst process comprises supplying an ammonia catalyst gas to the surface of the cured material layer.

20. The method of claim 17, wherein:

the first curing process is performed at a first pressure that is lower than atmospheric pressure; and the second curing process is performed at a second pressure that is lower than the atmospheric pressure and higher than the first pressure.

\* \* \* \* \*